US012754229B2

(12) United States Patent
Zeelen et al.

(10) Patent No.: US 12,754,229 B2
(45) Date of Patent: Oct. 6, 2026

(54) SYSTEM FOR SENSING CURRENT THROUGH A PASS FET

(71) Applicant: NEXPERIA B.V, Nijmegen (NL)

(72) Inventors: Patrick Zeelen, Nijmegen (NL); Paulo Lookman, Nijmegen (NL); Balasubramaniam Shammugasamy, Penang (MY); Justin Philpott, Bedford, NY (US)

(73) Assignee: Nexperia B.V., Nijmegen (NL)

( * ) Notice: Subject to any disclaimer, the term of this patent is extended or adjusted under 35 U.S.C. 154(b) by 166 days.

(21) Appl. No.: 18/742,571

(22) Filed: Jun. 13, 2024

(65) Prior Publication Data

US 2024/0418766 A1 Dec. 19, 2024

(30) Foreign Application Priority Data

Jun. 15, 2023 (EP) ..................................... 23179559

(51) Int. Cl.
*G01R 31/26* (2020.01)

(52) U.S. Cl.
CPC ................................ *G01R 31/2621* (2013.01)

(58) Field of Classification Search
CPC ............ G01R 31/2621; G01R 31/2623; G01R 31/2625; G01R 31/2626; G01R 31/2628
See application file for complete search history.

(56) References Cited

U.S. PATENT DOCUMENTS

2004/0227539 A1* 11/2004 Thiery ............... G01R 19/0092
324/762.09
2019/0273488 A1* 9/2019 Reiter .............. H03K 17/08116

* cited by examiner

*Primary Examiner* — Tung X Nguyen
(74) *Attorney, Agent, or Firm* — Ruggiero McAllister & McMahon LLC

(57) ABSTRACT

An electronic circuit for sensing a current through a pass FET is provided. A first sense circuit passes a first sense current in case a difference between a supply voltage and a source voltage of the pass FET and is small, and a second sense circuit passes a second sense current in case the difference between the supply voltage and the source voltage of the pass FET is large. The first sense current and the second sense current are representative of the current through the pass FET.

15 Claims, 5 Drawing Sheets

SYSTEM FOR SENSING CURRENT THROUGH A PASS FET

CROSS-REFERENCE TO RELATED APPLICATIONS

This application claims the benefit under 35 U.S.C. § 119(a) of European Patent Application No. 23179559.2 filed Jun. 15, 2023, the contents of which are incorporated by reference herein in their entirety.

BACKGROUND

1. Field of the Disclosure

The present disclosure relates to pass FETs. More specifically, the present disclosure relates to an electronic circuit for sensing the current through a pass FET.

2. Description of the Related Art

N-Channel Metal-Oxide-Semiconductor Field-Effect Transistors (NMOS FET) and P-Channel Metal-Oxide-Semiconductor Field-Effect Transistors (PMOS FET) are types of transistors that uses NMOS or PMOS as the conducting channel. NMOS and PMOS FETs are commonly used in digital and analog circuits for various applications such as switching, amplification, and signal routing.

The core component of an NMOS FET is an n-channel MOSFET, which typically includes a source terminal (connected to the input signal), a drain terminal (connected to the output), and a gate terminal. The gate terminal controls the conduction of current through the channel. It is electrically insulated from the channel by a thin layer of oxide, typically made of silicon dioxide ($SiO_2$). Applying a voltage to the gate terminal creates an electric field, which either allows or blocks the flow of current through the channel. The source and drain terminals are heavily doped regions of the semiconductor material (usually silicon) connected to the channel. The source is the terminal from which the current enters the channel, while the drain is the terminal through which the current leaves the channel. A substrate forms the material on which the NMOS FET is fabricated. It is typically connected to the most negative voltage level in the circuit (e.g., ground).

When a voltage is applied to the gate terminal, it creates an electric field that forms a conducting channel between the source and drain regions. The channel allows current to flow from the source to the drain. The amount of current that flows through the channel is controlled by the voltage applied to the gate terminal.

In an NMOS FET configuration, the source terminal may be connected to ground, while the drain terminal is connected to the output. An input signal may be applied to the gate terminal. When the gate voltage is sufficiently high, the NMOS FET turns "on," allowing current to flow from the source to the drain, thereby passing the input signal to the output. If the gate voltage is low, the NMOS FET turns "off," and little to no current flows from the source to the drain, effectively blocking the input signal. Such NMOS FET may be referred to as NMOS pass FET. In an alternative PMOS FET configuration the PMOS FET may be referred to as PMOS pass FET.

A charge pump is a circuit that may be used to generate a higher voltage level than the input voltage. In the context of a pass FET, a charge pump can be used to provide the required gate voltage for the FET to turn "on" and allow current to flow through it. In many pass FET applications, such as level shifters or voltage regulators, the gate voltage needs to be higher than the input voltage to ensure proper operation. A charge pump can be employed to boost the voltage level to meet this requirement.

An NMOS switch such as an NMOS pass FET or a PMOS switch such as a PMOS pass FET may include a sensing and protection circuit for preventing output overvoltage or overcurrent through the switch. Such protection circuit is also referred to as current sense circuit. An overvoltage clamp, also known as a voltage clamp or overvoltage protection, is a mechanism that can be used to limit the voltage across a pass FET or any other electronic component. It ensures that the voltage does not exceed a certain threshold, protecting the component from potential damage caused by excessive voltage levels. In the context of a pass FET, an overvoltage clamp may be implemented to prevent the gate-source voltage (Vgs) from reaching values that could harm the transistor or cause it to malfunction. The overvoltage clamp circuit is typically designed to limit the voltage at the gate terminal to a safe level. FETs used in a current sense circuit may be referred to as NMOS sense FETs or PMOS sense FETs, depending on its implementation.

Current sense circuits for pass FETs are known to be limited in sensing capabilities of the current through the pass FET. In other words, a current sense circuit is typically designed to either sense the current through a pass FET in a circuit where the difference between source voltage (Vsource) and supply voltage (Vcc) is small or sense the current through a pass FET in a circuit where the difference between Vsource and Vcc is large.

SUMMARY

The present disclosure aims to overcome the drawbacks identified in the background section. In particular, the present disclosure aims to overcome the sensing limitations of known current sense circuits for pass FETs.

The present disclosure provides an electronic circuit that can sense the current through a pass FET, such as an NMOS pass FET or a PMOS pass FET, for substantially any value of drain-source voltage (Vds). The current sense circuit of the pass FET of the present disclosure enables sensing of the current through the pass FET for both large and small differences between Vsource and Vcc, According to an aspect of the present disclosure, an electronic circuit is presented for sensing a current through a pass FET. The electronic circuit may include a first sense circuit configured to pass a first sense current in case a difference between a supply voltage and a source voltage of the pass FET is small. Here, small is to be understood to mean that the difference between the supply voltage and the source voltage approaches zero volts. The electronic circuit may further include a second sense circuit configured to pass a second sense current in case the difference between the supply voltage and the source voltage of the pass FET is large. Here, large is to be understood to mean that the difference between the supply voltage and the source voltage approaches the supply voltage, e.g., when the source voltage is connected to ground. The first sense circuit may include a first switch that is configured to turn off when the second sense circuit is active and turn on when the second sense circuit is inactive. The second sense circuit may include a second switch that is configured to turn off when the first sense circuit is active and turn on when the second sense circuit is active. The first sense current and the second sense current may be representative of the current through the pass FET.

In an embodiment, the first sense circuit may include a first sense FET, the first switch and a first sense amplifier. One leg of the first sense FET may be connected to the supply voltage. Another one leg of the first sense FET may be connected to a negative input of the first sense amplifier and to one leg of the first switch. A gate of the first sense FET may be connected to the charge pump. A positive input of the first sense amplifier may be connected to the source voltage. An output of the first sense amplifier may be connected to a gate of the switch for switching the first switch and enabling the first current to flow when the first switch is switched on.

In an embodiment, the first sense FET may be an NMOS FET.

In an embodiment, the first switch may be a PMOS FET.

In an embodiment, the second sense circuit may include a second sense FET, the second switch and a second sense amplifier. One leg of the second sense FET may be connected to the supply voltage through a resistor and to a positive input of the second sense amplifier. Another one leg of the second sense FET may be connected to the source voltage. A gate of the second sense FET may be connected to the charge pump. A negative input of the second sense amplifier may be connected to the supply voltage via a further resistor. An output of the second sense amplifier may be connected to a gate of the second switch for switching the second switch and enabling the second current to flow when the second switch is on.

In an embodiment, the second sense FET may be an NMOS FET.

In an embodiment, the second switch may be a PMOS FET.

In an embodiment, the pass FET may be an NMOS pass FET.

According to an aspect of the present disclosure, an electronic device is presented. The electronic device may include an electronic circuit having one or more of the above described features.

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

BRIEF DESCRIPTION OF THE DRAWINGS

Embodiments of the present disclosure will now be described, by way of example only, with reference to the accompanying schematic drawings in which corresponding reference symbol indicate corresponding parts, in which.

Figure 1:
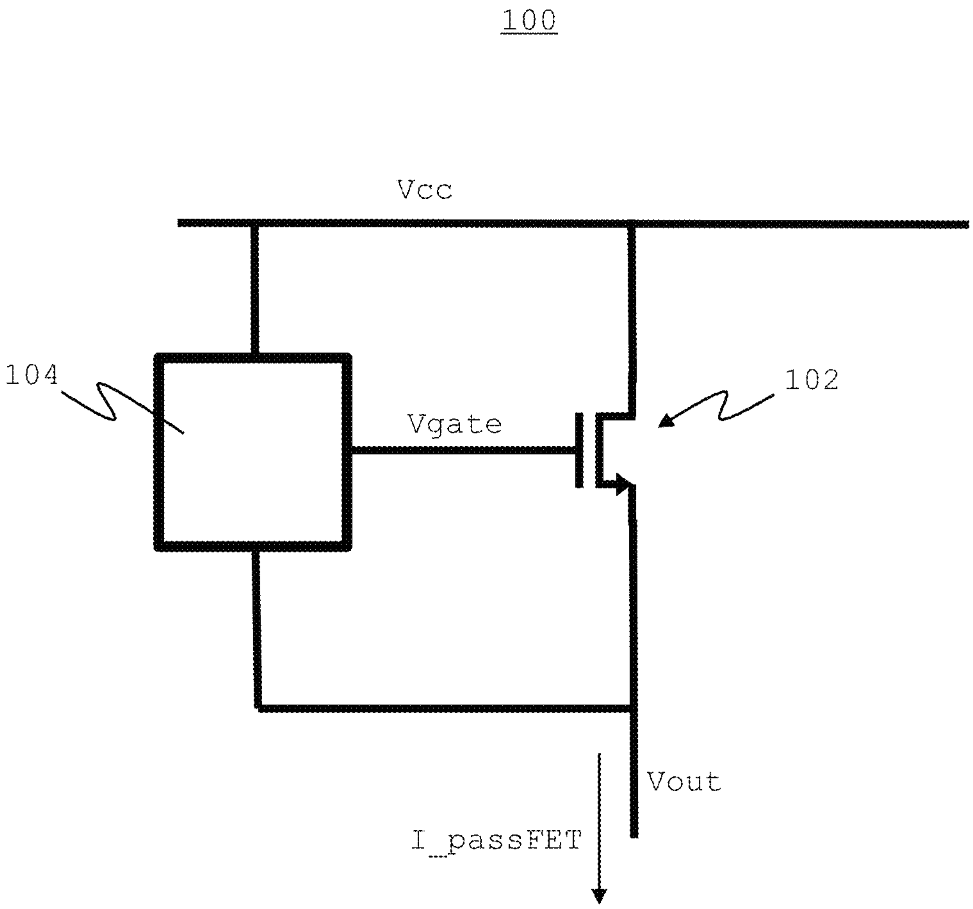
FIG.1 (Prior Art)
FIG. 1 shows a simplified example schematics of an electronic circuit including an NMOS pass FET and a charge pump.

The figures are intended for illustrative purposes only, and do not serve as restriction of the scope of the protection as laid down by the claims.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same example.

Furthermore, the described features, advantages, and characteristics of the present disclosure may be combined in any suitable manner in one or more embodiments. One skilled in the relevant art will recognize, in light of the description herein, that the present disclosure can be practiced without one or more of the specific features or advantages of a particular embodiment. In other instances, additional features and advantages may be recognized in certain embodiments that may not be present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

In a current sense circuit the current through an NMOS pass FET may be sensed and limited. This may be done in normal operation with a small voltage drop cross the NMOS pass FET. Sensing may alternatively be performed in a short circuit operation with supply voltage Vcc connected to the drain of the NMOS pass FET and the source of the NMOS pass FET shorted to ground. The present disclosure provides an electronic circuit that can sense the current through the NMOS pass FET for the full range of Vsource between Vcc and ground.

In the following, examples circuits are shown including an NMOS pass FET. The present disclosure is not limited to NMOS pass FETs and may be applied to PMOS pass FETs with the required modifications to the circuits, such as changing the voltages applied to Vcc and Vsource and as known per se.

FIG. 1 shows a simplified example schematics of an electronic circuit 100 including an NMOS pass FET 102 and a charge pump 104. Vcc may be connected to the drain of the NMOS pass FET 102 and the charge pump 104. The charge pump 104 may further receive the output voltage (Vout) of the NMOS pass FET 102 to control the gate voltage Vgate 102. Vgate may be used for switching the NMOS pass FET 102 "on" and "off". Furthermore, Vgate may be used for controlling the current through the pass FET. A current sense circuit may be added to the electronic circuit 100 to sense the current (I_passFET) through the NMOS pass FET 102.

Figure 2:
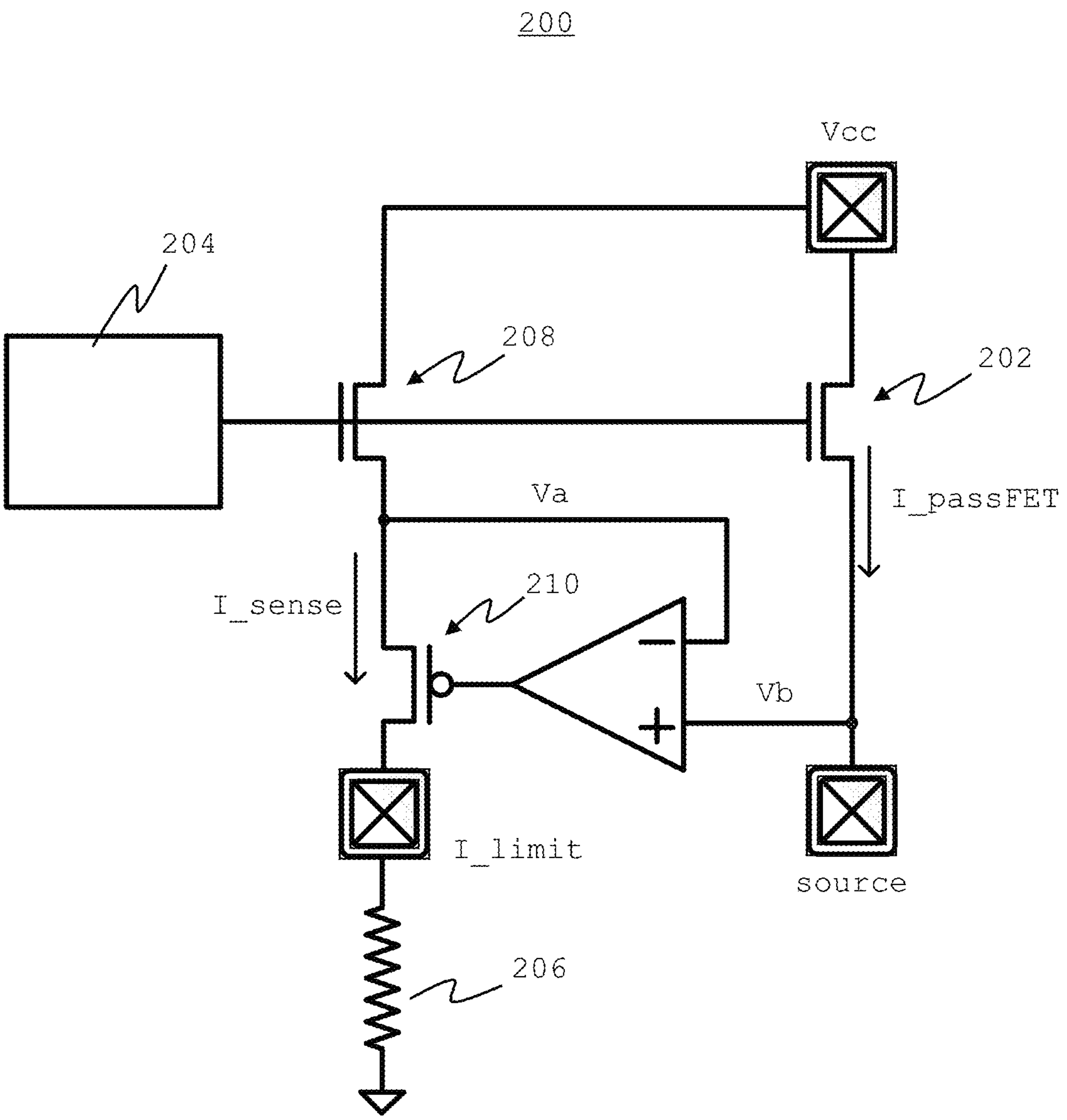
FIG. 2 shows an example schematics of an electronic circuit with an NMOS pass FET and including a current sense circuit.

FIG. 2 shows an example schematics of an electronic circuit 200 with an NMOS pass FET 202 and including a current sense circuit for sensing I_passFET when the difference between Vsource and Vcc is small. In FIG. 2, the current sense circuit includes a FET 208 for sensing purposes, which may be referred to as sense FET. The sense FET 208 triggers a sense current (I_sense). Negative feedback ensures that Va≈Vb. With the pass FET 202 valued "N" and the sense FET 208 valued "1", I_sense=(1/N)*I_passFET. I_sense flows through an external resistor 206 (Rsense), creating voltage V at I_limit. By comparing V at I_limit to a fixed internal reference voltage, Rsense 206 can be used to set the current limit level at which current needs to be limited. When the source of the pass FET 202 (Vout) is shorted to ground, the current through the pass FET 202 will be very high (pass FET 202 has large Vds), but the current through the sense FET 208 will approach to 0. This is because the feedback loop will attempt to pull node A to ground, therefore Vds of M2 210 goes to 0. Disadvantageously, I_sense becomes unmeasurable in the circuit of FIG. 2 when the difference between Vsource and Vcc is large.

Figure 3:
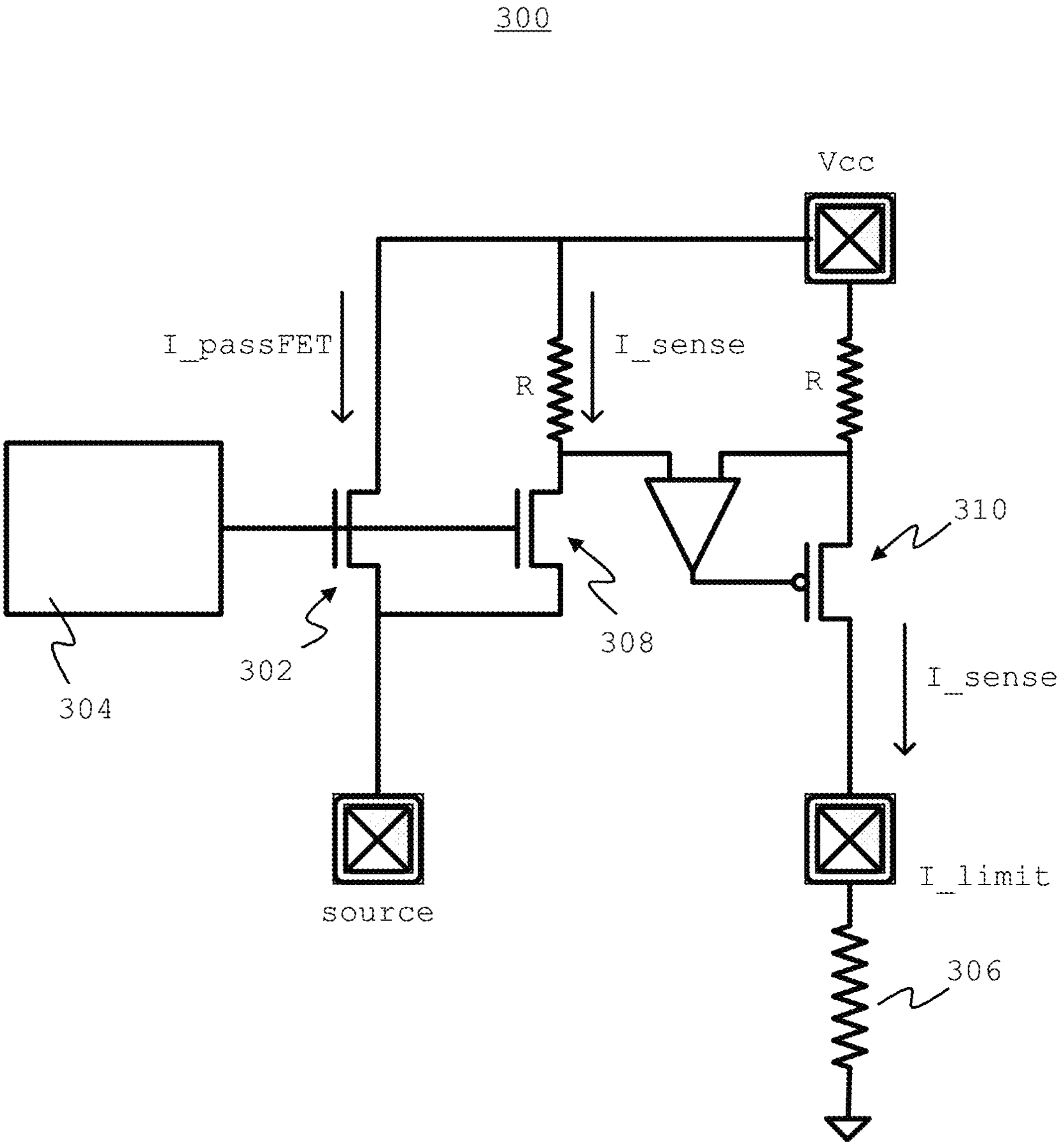
FIG. 3 shows an example schematics of another electronic circuit with an NMOS pass FET and including a current sense circuit.

FIG. 3 shows an example schematics of an electronic circuit 300 with an NMOS pass FET 302 and including a current sense circuit for sensing I_passFET when the difference between Vsource and Vcc is large. In this example, Vsource<<Vcc, e.g., Vsource may be connected to ground. In FIG. 3, the current sense circuit includes a FET 308 for sensing purposes, which may be referred to as sense FET. The sense FET 308 triggers a sense current (I_sense). For low values of source, pass FET 302 valued "N" and sense FET 308 valued "1" act as a current mirror N:1. Resistance R should be sufficiently low for not to have significant effect on this current mirror. An amplifier is used for copying the current through the sense FET 308 to the external resistor 306, with I_sense=I_passFET/N. Disadvantageously, I_sense becomes unmeasurable in the circuit of FIG. 3 when the difference between Vsource and Vcc is small.

Figure 4:
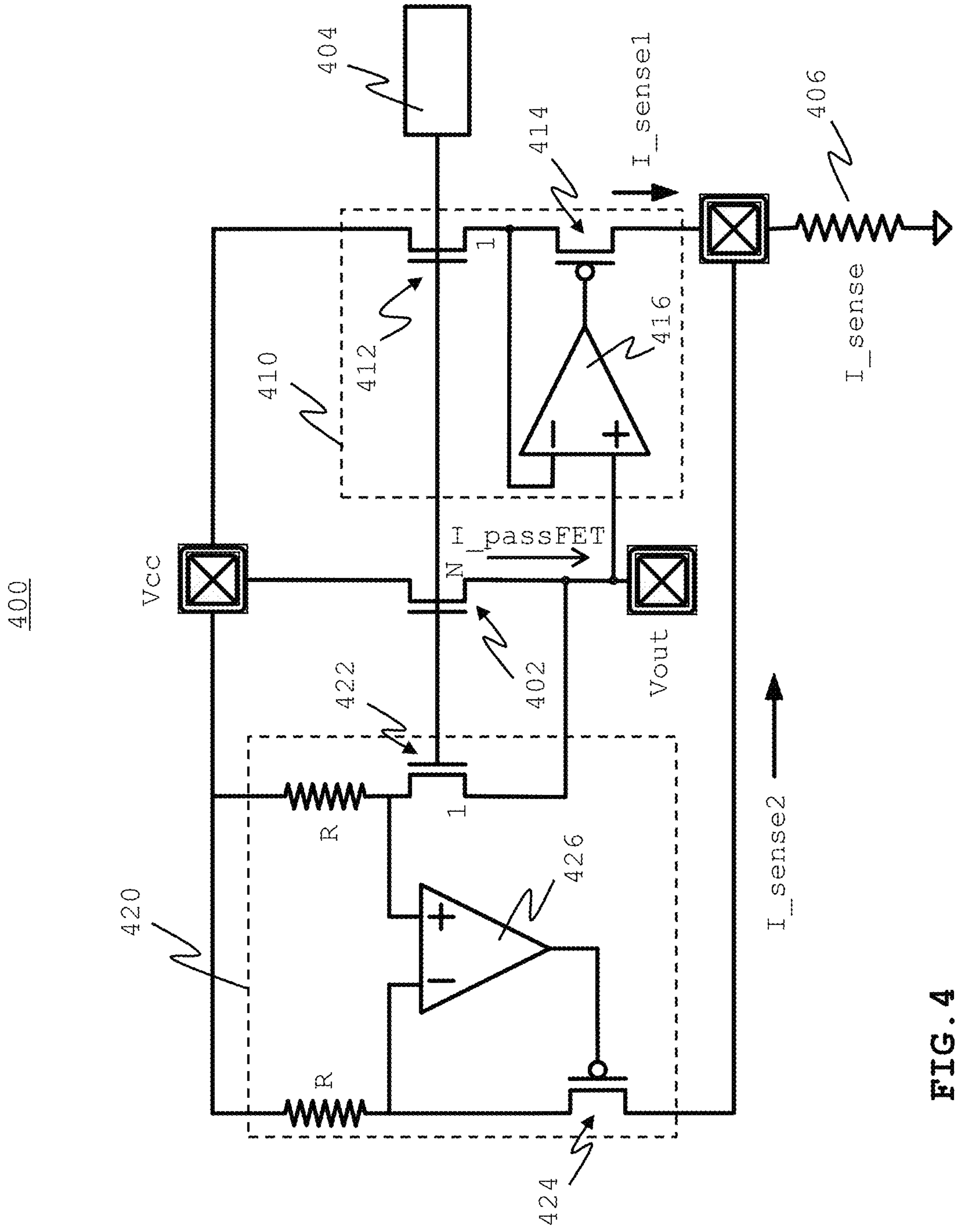
FIG. 4 shows an example embodiment of the present disclosure of schematics of an electronic circuit with an NMOS pass FET including a current sense circuit.

FIG. 4 shows an example embodiment of schematics of an electronic circuit 400 with an NMOS pass FET 402 including a current sense circuit for sensing the current through the NMOS pass FET 402 by measuring I_sense. Advantageously, the current sense circuit of FIG. 4 works for the full range of Vsource between Vcc and ground, not limited to the difference between Vcc and Vsource such as shown in FIG. 2 or FIG. 3. In FIG. 4 Vsource is shown as Vout.

Similar to FIG. 1, the pass FET 402, in this example an NMOS pass FET 402, may be connected to a charge pump 404 on its gate, while the drain may be connected to Vcc and the source may be connected to Vout. When the pass FET 402 is switched on by the charge pump 404, the current through the pass FET 402, depicted I_passFET, may be measured via a sense resistor 406 and a sense current I_sense through this sense resistor 406.

In the example embodiment of FIG. 4, the current sense circuit includes two sense circuits. A first sense circuit 410 may include a first sense FET 412, a first switch such as first PMOS FET 414, and a first sense amplifier 416 for triggering a first sense current I_sense1. A second sense circuit 420 may include a second sense FET 422, a second switch such as second PMOS FET 424, and a second sense amplifier 426 for triggering a second sense current I_sense2.

In the first sense circuit 410, one leg of the first sense FET 412, e.g., the drain in case of an NMOS sense FET 412, may be connected to Vcc. The other leg of the first sense FET 412, e.g., the source in case of an NMOS sense FET 412, may be connected to the negative input of the first sense amplifier 416 and to one leg of the first switch 414. The gate of the first sense FET 412 may be connected to the charge pump 404. The positive input of the first sense amplifier 416 may be connected to Vout. The output of the first sense amplifier 416 switches the first switch 414, thereby enabling current I_sense1 to flow to the sense resistor 406. Note that the output of the first sense amplifier controls the gate of the first output stage. This transistor is switched off when the second sense amplifier is used by a switch that is not part of the figures.

In the second sense circuit 420, one leg of the second sense FET 422, e.g., the drain in case of an NMOS sense FET 422, may be connected to Vcc through a resistor R and to the positive input of the second sense amplifier 426. The other leg of the second sense FET 422, e.g., the source in case of an NMOS sense FET 422, may be connected to Vout. The gate of the second sense FET 422 may be connected to the charge pump 404. The negative input of the second sense amplifier 426 may be connected to Vcc via a further resistor R. The output of the second sense amplifier 426 switches the second switch 424, thereby enabling current I_sense2 to flow to the sense resistor 406. Note that the output of the second sense amplifier controls the gate of the second output stage. This transistor is switched off when the first sense amplifier is used by a switch that is not part of the figures.

When Vout is near Vcc, the second switch 424 is off and the first switch 414 is on, resulting in I_sense2=0 and I_sense1=I_passFET/N. When Vout is much lower than Vcc, the first switch 414 is off and the second switch 424 is on, resulting in I_sense1=0 and I_sense2=I_passFET/N.

Thus advantageously, by using the two sense circuits 410, 420 as shown in FIG. 4, the current through the external sense resistor 406 is I_passFET/N for the full Vout range between Vcc and 0, which I_passFET may be measured through sense resistor 406 as I_sense.

The first sense circuit 410 may be similar to the current sense circuit of FIG. 2. The second sense circuit 420 may be similar to the current sense circuit of FIG. 3. Thus, in the example embodiment of FIG. 4, the advantages of each of the current sense circuits of FIG. 2 and FIG. 3 may be achieved, i.e., having sensing capabilities in specific Vcc-Vout scenarios, while taking away the shortcomings of each of the current sense circuits of FIG. 2 and FIG. 3, namely being restricted to the specific Vcc-Vout scenarios.

In the figures, 210, 310, 422 and 414 are referred to as "switch". Typically, these devices are the output stage of a control loop. The first output stage may be switched off when the second current sense circuit is used and the second output stage is switched off when the first current sense circuit is used. The actual switches taking care of this are not part of the figures.

Figure 5:
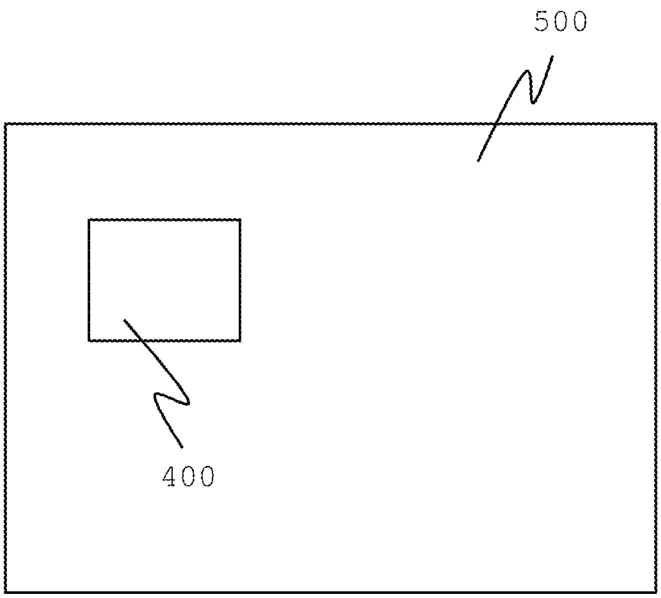
FIG. 5 illustrated an electronic device including an electronic circuit according to an embodiment of the present disclosure.

As illustrated in FIG. 5, the electronic circuit of the present disclosure, such as electronic circuit 400 of FIG. 4, may be implemented in or part of any device 500 that uses a pass FET such as pass FET 402 of FIG. 4.

The invention claimed is:

1. An electronic circuit for sensing a current through a pass Field-Effect Transistor (FET), comprising:

a first sense circuit configured to pass a first sense current (I_sense1) should there be a difference between a supply voltage (Vcc) and a source voltage (Vout) of the pass FET that is small;

a second sense circuit configured to pass a second sense current (I_sense2) should the difference between the supply voltage (Vcc) and the source voltage (Vout) of the pass FET be large;

wherein the first sense circuit comprises a first sense FET, a first sense amplifier, and a first switch that is configured to turn off when the difference between the supply voltage and the source voltage of the pass FET is large and turn on when the difference between the supply voltage and the source voltage of the pass FET is small;

wherein one leg of the first sense FET is connected to the supply voltage (Vcc), wherein another one leg of the first sense FET is connected to a negative input of the first sense amplifier and to one leg of the first switch;

wherein the first sense FET has a gate that is connected to a charge pump, wherein the first sense amplifier has a positive input that is connected to the source voltage (Vout); and wherein the first sense amplifier has an output that is connected to a gate of the switch for switching the first switch and enabling the first sense current to flow when the first switch is switched on;

wherein the second sense circuit comprises a second switch that is configured to turn off when the difference between the supply voltage and the source voltage of the pass FET is small and turn on when the difference between the supply voltage and the source voltage of the pass FET is large; and wherein the first sense current and the second sense current are representative of the current through the pass FET.

2. The electronic circuit according to claim 1, wherein the first sense FET is a N-Channel Metal-Oxide-Semiconductor (NMOS) FET.

3. The electronic circuit according claim 2, wherein the first switch is a P-Channel Metal-Oxide-Semiconductor (PMOS) FET.

4. An electronic device comprising an electronic circuit according to claim 3.

5. The electronic circuit according to claim 2, wherein the pass FET is an NMOS pass FET.

6. An electronic device comprising an electronic circuit according to claim 2.

7. The electronic circuit according claim 1, wherein the first switch is a P-Channel Metal-Oxide-Semiconductor (PMOS) FET.

8. The electronic circuit according to claim 7, wherein the pass FET is an NMOS pass FET.

9. An electronic device comprising an electronic circuit according to claim 7.

10. The electronic circuit according to claim 1, wherein the pass FET is an NMOS pass FET.

11. An electronic device comprising an electronic circuit according to claim 1.

12. An electronic circuit for sensing a current through a pass Field-Effect Transistor (FET), comprising:

a first sense circuit configured to pass a first sense current (I_sense1) should there be a difference between a supply voltage (Vcc) and a source voltage (Vout) of the pass FET that is small;

a second sense circuit comprising a second sense FET, a second sense amplifier and a second switch that is configured to turn off when the difference between the supply voltage (Vcc) and the source voltage (Vout) of the pass FET is small and turn on and pass a second sense current (I_sense2) when the difference between the supply voltage (Vcc) and the source voltage (Vout) of the pass FET is large, wherein the second sense circuit comprises a second sense FET, the second switch and a second sense amplifier;

wherein the second sense FET has one leg that is connected to the supply voltage (Vcc) through a resistor and to a positive input of the second sense amplifier, wherein the second sense FET has another one leg that is connected to the source voltage (Vout), and wherein the second sense FET has a gate that is connected to the charge pump; and wherein the second sense amplifier has a negative input that is connected to the supply voltage (Vcc) via a further resistor, and wherein the second sense amplifier has an output that is connected to a gate of the second switch for switching the second switch and enabling the second sense current to flow when the second switch is on.

13. The electronic circuit according to claim 12, wherein the second sense FET is an NMOS FET.

14. The electronic circuit according claim 13, wherein the second switch is a PMOS FET.

15. The electronic circuit according claim 12, wherein the second switch is a PMOS FET.

* * * * *